(12) United States Patent
Usa et al.

(10) Patent No.: US 7,850,441 B2
(45) Date of Patent: Dec. 14, 2010

(54) MOLD STRUCTURE

(75) Inventors: Toshihiro Usa, Kanagawa (JP); Kenji Ichikawa, Kanagawa (JP); Kazunori Komatsu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 457 days.

(21) Appl. No.: 11/946,198

(22) Filed: Nov. 28, 2007

(65) Prior Publication Data

US 2008/0142680 A1    Jun. 19, 2008

(30) Foreign Application Priority Data

Dec. 5, 2006    (JP) .............................. 2006-328796

(51) Int. Cl.
    *B29D 17/00*    (2006.01)
(52) U.S. Cl. ...................... 425/385; 425/810
(58) Field of Classification Search ................. 425/385, 425/403, 470, 810; 264/1.33, 2.5, 106, 107, 264/293; 428/64.4; 369/111, 275.3, 275.4
    See application file for complete search history.

(56) References Cited

U.S. PATENT DOCUMENTS

| | | | | |
|---|---|---|---|---|
| 2,993,234 | A | * | 7/1961 | Hayashi et al. .............. 264/107 |
| 4,931,336 | A | * | 6/1990 | Haneda ...................... 428/64.4 |
| 4,947,384 | A | * | 8/1990 | Suzuki et al. ................ 369/279 |
| 5,325,353 | A | * | 6/1994 | Sasaki et al. ............. 369/275.2 |
| 5,763,037 | A | * | 6/1998 | Ohtomo et al. ............. 428/64.1 |
| 5,972,459 | A | * | 10/1999 | Kawakubo et al. .......... 428/64.1 |
| 6,287,660 | B1 | * | 9/2001 | Hosaka et al. .............. 428/64.1 |
| 6,616,867 | B2 | * | 9/2003 | Kerfeld ...................... 264/1.33 |
| 6,656,392 | B1 | * | 12/2003 | Medower et al. ........... 264/1.33 |
| 6,844,044 | B2 | * | 1/2005 | Sabi .......................... 428/64.1 |
| 6,899,936 | B2 | * | 5/2005 | Takemori et al. ........... 428/64.1 |
| 6,908,725 | B2 | * | 6/2005 | Blankenbeckler et al. ................... 430/270.13 |
| 7,049,589 | B2 | * | 5/2006 | Yamaguchi et al. ......... 250/310 |
| 7,247,343 | B2 | * | 7/2007 | Suwa et al. ................. 427/128 |
| 7,316,836 | B2 | * | 1/2008 | Wada et al. ................ 428/64.1 |

(Continued)

FOREIGN PATENT DOCUMENTS

JP    56-119934 A    9/1981

(Continued)

OTHER PUBLICATIONS

Lee et al., Effect of line edge roughness and line width roughness on sub-100 nm device performance, Advanced in Resist technology XXI, edited by John L. Sturtevant, pp. 426-433.*

(Continued)

*Primary Examiner*—Maria Veronica D Ewald
*Assistant Examiner*—Dimple N Bodawala
(74) *Attorney, Agent, or Firm*—Sughrue Mion, PLLC

(57) ABSTRACT

There is provided a mold structure containing a substrate, and a plurality of convex portions formed in the shape of concentric circles at predetermined intervals on one surface of the substrate, wherein a cross-sectional shape of the convex portions with respect to a radial direction of the concentric circles is such that a middle width M of each of the convex portions with respect to a heightwise direction is greater than a width T of a top portion of each of the convex portions with respect to the radial direction of the concentric circles.

6 Claims, 13 Drawing Sheets

U.S. PATENT DOCUMENTS

| | | | |
|---|---|---|---|
| 7,554,898 B2 * | 6/2009 | Blankenbeckler et al. | 369/275.3 |
| 2003/0021942 A1 * | 1/2003 | Koide et al. | 428/64.4 |
| 2003/0138589 A1 * | 7/2003 | Takemori et al. | 428/64.4 |
| 2003/0169678 A1 * | 9/2003 | Nakano et al. | 369/277 |
| 2004/0066732 A1 * | 4/2004 | Takemoto et al. | 369/275.4 |
| 2004/0119197 A1 * | 6/2004 | Gorczyca et al. | 264/219 |
| 2004/0204328 A1 * | 10/2004 | Zhang et al. | 510/175 |
| 2005/0007942 A1 * | 1/2005 | Horai et al. | 369/275.4 |
| 2005/0030881 A1 * | 2/2005 | Endoh et al. | 369/275.4 |
| 2005/0048248 A1 * | 3/2005 | Ito et al. | 428/64.4 |
| 2005/0088954 A1 * | 4/2005 | Hosokawa | 369/275.4 |
| 2005/0219997 A1 * | 10/2005 | Morita et al. | 369/275.4 |
| 2007/0030795 A1 * | 2/2007 | Kikuawa et al. | 369/283 |
| 2008/0063984 A1 * | 3/2008 | Zhang et al. | 430/311 |
| 2009/0029189 A1 * | 1/2009 | Moriwaki et al. | 428/826 |

FOREIGN PATENT DOCUMENTS

| | | |
|---|---|---|
| JP | 02-201730 A | 8/1990 |
| JP | 03-022211 A | 1/1991 |
| JP | 04001025 A * | 1/1992 |
| JP | 2004-221465 A | 8/2004 |
| WO | WO 2005/024799 A1 * | 3/2005 |

OTHER PUBLICATIONS

An introduction to CD metrology in the Semiconductor industry, Slides 7-8.*

Ichikawa et al., Design of Ni mold for discrete track media, IEEE Transaction of Magnetics, vol. 44, No. 11, Nov. 2008, pp. 3450-3453.*

Acikgoz et al., Nanoscale Patterning by UV nanoimprint lithography . . . , Applied Materials & Interfaces, vol. 1, No. 11, Published on Oct. 23, 2009, pp. 2645-2650.*

* cited by examiner

MOLD STRUCTURE

BACKGROUND OF THE INVENTION

1. Field of the Invention

The present invention relates to a mold structure provided with a pattern of concavities and convexities for transferring information onto a magnetic recording medium, in particular a mold structure for nanoimprinting.

2. Description of the Related Art

In recent years, hard disk drives that are superior in reading and writing swiftness and costs have begun being incorporated in portable devices such as cellular phones, compact acoustic devices and video cameras as major storage devices, and a technique for improving recording density has been required to meet the demand for further reduction in size and enlargement in capacity.

In order to increase the recording density of hard disk drives, methods such as improvement in the performance of magnetic recording media and reduction in the magnetic head width have been conventionally used; however, as spaces between data tracks are made small, effects of magnetism between adjacent tracks (crosstalk) and effects of heat fluctuation become inevitably great, hence a limitation on improvement in surface recording density by means of the narrowing of magnetic heads or the like.

Accordingly, magnetic recording media in a form referred to as discrete track media have been proposed as a means of removing noise caused by crosstalk (refer to Japanese Patent Application Laid-Open (JP-A) Nos. 56-119934 and 02-201730).

In discrete track media, magnetic interference between adjacent tracks is reduced by means of discrete structures in which nonmagnetic guard band regions are provided between adjacent tracks so as to magnetically separate tracks from one another.

Also, magnetic recording media in a form referred to as patterned media, in which bits for recording signals are provided in predetermined patterns of shape have been proposed as a means of removing demagnetization caused by heat fluctuation (refer to JP-A No. 03-22211).

As a method for producing the discrete track media and the patterned media, there is an imprinting method in which a desired pattern is transferred onto a resist layer formed on a surface of a magnetic recording medium by using a resist pattern forming mold (hereinafter otherwise referred to as "mold"), as disclosed in JP-A No. 2004-221465.

However, as to a resist pattern forming mold described in JP-A No. 2004-221465, since convex portions formed on a surface thereof are shaped like rectangles in cross-section, it is impossible to push out a resist layer sufficiently when the mold is pressed against the resist layer and thus impossible to obtain an appropriate resist pattern; consequently, the convex portions of the mold structure may possibly vary in height. This is a phenomenon which can also arise when the convex portions pressed against the resist layer are separated from the resist layer.

Thus, a mold structure capable of efficiently transferring a pattern to a resist layer applied onto a substrate of a magnetic recording medium has not yet been realized, and provision of the mold structure is hoped for, as things stand.

BRIEF SUMMARY OF THE INVENTION

The present invention is aimed at solving the aforesaid problems in related art and achieving the following objects.

Specifically, an object of the present invention is to provide a mold structure capable of efficiently transferring a high-quality pattern onto discrete track media and patterned media and forming the pattern thereon, with the use of a nanoimprinting technique.

Also, another object of the present invention is to provide a mold structure with less crosstalk, etc., capable of transferring a pattern of high signal integrity onto discrete track media and patterned media and forming the pattern thereon.

The mold structure of the present invention is a mold structure including a substrate, and a plurality of convex portions formed in the shape of concentric circles at predetermined intervals on one surface of the substrate, wherein a cross-sectional shape of the convex portions with respect to the radial direction of the concentric circles is such that a middle width M of each of the convex portions with respect to the heightwise direction is greater than a width T of a top portion of each of the convex portions with respect to the radial direction of the concentric circles.

According to the present invention, it is possible to solve the problems in related art and to provide a mold structure capable of efficiently transferring a high-quality pattern onto discrete track media and patterned media and forming the pattern thereon, with the use of a nanoimprinting technique.

Also, according to the present invention, it is possible to provide a mold structure with less crosstalk, etc., capable of transferring a pattern of high signal integrity onto discrete track media and patterned media and forming the pattern thereon.

DETAILED DESCRIPTION OF THE INVENTION

The following explains a mold structure of the present invention with reference to the drawings.

<Constitution of Mold Structure>

Figure 1:
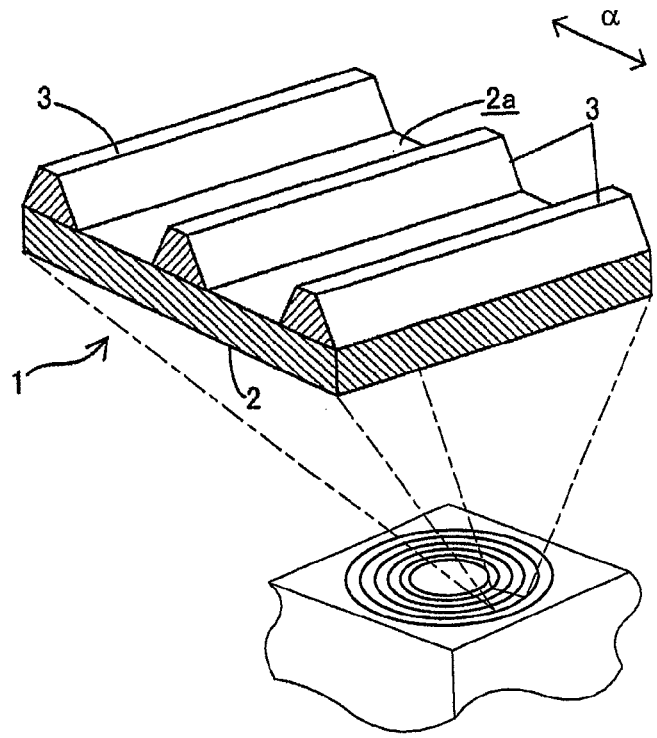
FIG. 1 is a perspective view showing an example of the constitution of a mold structure according to a first embodiment of the present invention.

FIG. 1 is a partially perspective view showing the constitution of a mold structure according to a first embodiment of the present invention. FIG. 2 is a cross-sectional view showing the constitution of the mold structure according to the first embodiment of the present invention.

In FIG. 1, the arrow a denotes a radial direction.

As shown in FIG. 1, a mold structure 1 according to the present embodiment is a mold structure in which a plurality of convex portions 3 are formed in the shape of concentric circles at predetermined intervals on one surface 2a (hereinafter otherwise referred to as "reference surface 2a") of a disk-shaped substrate 2.

Additionally, nickel, silicon, a quartz plate, glass, aluminum, ceramic, synthetic resin or the like is used for the substrate 2.

Also, at least upper parts of the convex portions 3 with respect to the radial direction of the concentric circles (the direction in which the convex portions 3 are disposed at predetermined intervals) are shaped like trapezoids in cross-section.

Figure 2A:
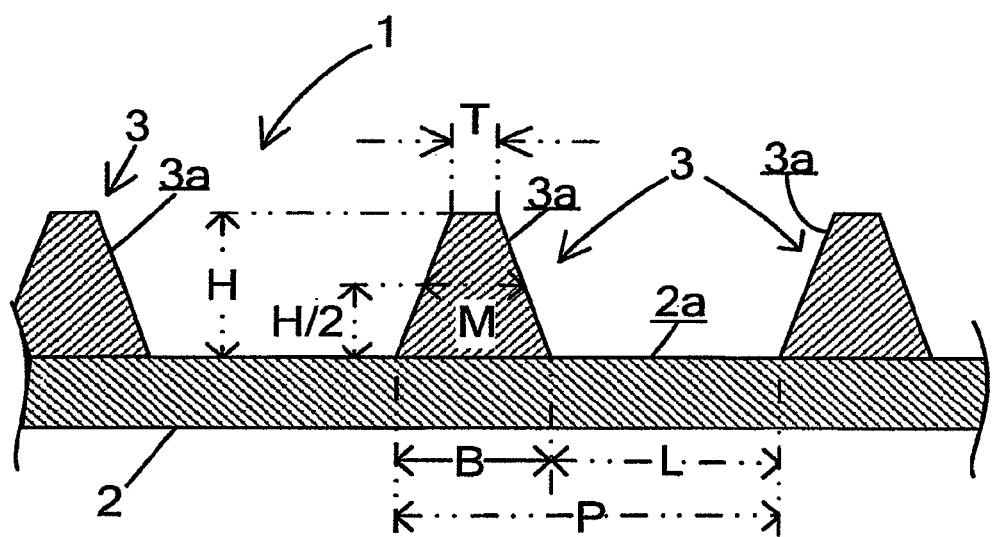
FIG. 2A is a cross-sectional view showing an example of the constitution of the mold structure according to the first embodiment of the present invention.

Specifically, as shown in FIG. 2A, in a cross-section of the convex portions 3 with respect to the radial direction of the concentric circles, the middle width M of each of the convex portions 3 with respect to the heightwise direction is greater than the width T of a top portion of each of the convex portions 3 with respect to the radial direction of the concentric circles.

In the after-mentioned explanations of the present embodiment, "cross-section (or cross-sectional shape)" denotes a cross-section (or a cross-sectional shape) with respect to the radial direction of the concentric circles (the direction in which the convex portions 3 are disposed at predetermined intervals), unless there is a specific mention to state otherwise.

Here, when the height of each convex portion 3 (the shortest distance from the reference surface 2a to the top portion of each convex portions 3) is denoted by H, the aforesaid middle width M denotes the width of each convex portion 3 in cross-section at a height of H/2 above the reference surface 2a. It is desirable that the middle width M be 50 nm or less.

Note that when the reference surface 2a cannot be regarded as flat, the height H is calculated, as a surface that lies on the side where the convex portions 3 of the substrate 2 are formed and that has been flattened is assumed to be the reference surface 2a.

The bottom width B of each convex portion 3 denotes the width of each convex portion 3 in cross section on the reference surface 2a. It should be noted that a width B' (see FIG. 2B) may be employed instead of the bottom width B of each convex portion 3, within such a range that the width B' correlates with 10% or less of the height H above the reference surface 2a in the direction from the reference surface 2a to the top portion of each convex portion 3.

The top portion width T of each convex portion 3 denotes the width of the top portion of each convex portion 3 which is roughly parallel to the reference surface 2a in the cross-sectional shape of the convex portions 3. It should be noted that the top portion width T of each convex portion 3 will be difficult to measure when its top portion is complex in shape; accordingly, a width T' (see FIG. 2B) may be employed instead of the top portion width T, within such a range that the width T' correlates with 10% or less of the height H below an apical portion of each convex portion 3 in the direction from the apical portion to the reference surface 2a.

Here, the track pitch P denotes the sum of the distance L between the convex portions 3 on the reference surface 2a and the aforesaid bottom width B of one convex portion 3. In the present embodiment, it is desirable that the middle width M of each convex portion 3 of the mold structure be half the track pitch P or less.

Note that the aforesaid distance L denotes the distance between the intersection where the tangent to a side surface 3a of one convex portion 3 at a height of H/2 meets the reference surface 2a and the intersection where the tangent to a side surface 3a of another convex portion 3, adjacent to the one convex portion 3, at a height of H/2 meets the reference surface 2a, in the cross-section with respect to the radial direction of the concentric circles.

Figure 2B:
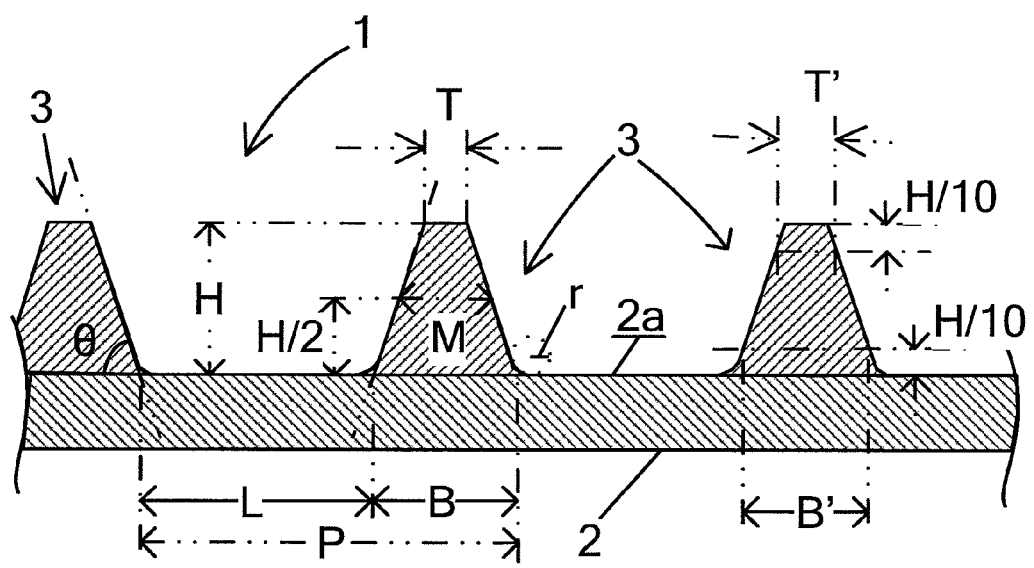
FIG. 2B is another cross-sectional view showing an example of the constitution of the mold structure according to the first embodiment of the present invention.

In the mold structure 1 of the present embodiment, it is desirable that in the cross-sectional shape of the convex portions 3, the aspect ratio (the ratio of the height H to the bottom width B of the interface between each convex portion 3 and the reference surface 2a=H/B) be 5 or less, as shown in FIG. 2B. When this aspect ratio exceeds 5, there will be a greater number of sites between the convex portions 3, into which imprint resist cannot permeate further, thereby possibly causing a problem of height variation.

Also, it is desirable that the angles θ between the reference surface 2a and side surfaces (the surfaces of any two adjacent convex portions 3, that face each other) 3a of each convex portion 3 satisfy 45°≦θ<90°. Note that the aforesaid angles θ denote the angles between the tangents to the side surfaces 3a of each convex portion 3 at a height of H/2 and the reference surface 2a, in the cross-section with respect to the radial direction of the concentric circles.

Also, as to the shape of the convex portions 3 in the mold structure 1 of the present embodiment, the reference surface 2a and the side surfaces 3a of each convex portion 3 may be joined to each other in such a manner as to be shaped like curved lines in the cross-section with respect to the radial direction of the concentric circles, as shown in FIG. 2B. It is desirable that the curvature radius r of these curved portions be 10 nm or less.

Further, in the present embodiment, it is desirable that the line width roughness (LWR) value of the middle width M with respect to the lengthwise direction of the convex portions 3 be 20 nm or less. When the line width roughness (LWR) value of the middle width M exceeds 20 nm, the area where the convex portions 3 are in contact with imprint resist enlarges, and thus there may possibly be a problem with the peelability of the imprint resist.

Additionally, it is desirable that the line edge roughness (LER) value of the middle width M with respect to the lengthwise direction of the convex portions 3 be 20 nm or less. When the line edge roughness (LER) value of the middle width M exceeds 20 nm, the area where the convex portions 3 are in contact with imprint resist enlarges, and thus there may possibly be a problem with the peelability of the imprint resist.

A method for measuring a line width roughness (LWR) value and a line edge roughness (LER) value in relation to a line pattern disclosed in JP-A No. 2006-38779 was applied to a method for measuring the line width roughness (LWR) value and the line edge roughness (LER) value in the present embodiment with respect to the shape of the convex portions 3 as seen from the direction of a normal to the reference surface 2a.

<Method for Producing Mold Structure>

The following explains a method for producing a mold structure according to the present invention, with reference to the drawings.

First Embodiment

Figure 3:
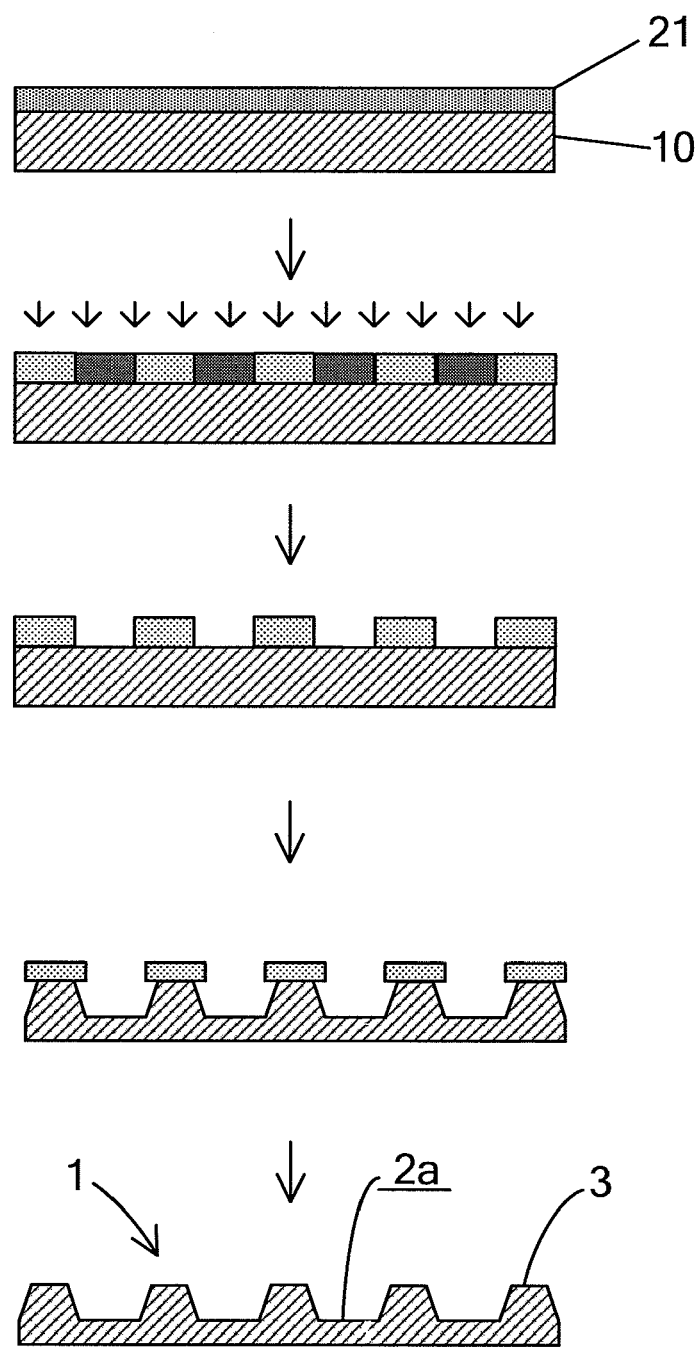
FIG. 3 is still another cross-sectional view showing a method for producing the mold structure according to the first embodiment of the present invention.

FIG. 3 is a cross-sectional view showing a method for producing a mold structure according to a first embodiment. As shown in FIG. 3, first of all, a photoresist solution of PMMA (polymethylmethacrylate), etc. is applied onto an Si (silicon) substrate 10 by means of spin coating or the like, and a photoresist layer 21 is thus formed.

After that, while the substrate 10 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist.

Subsequently, the photoresist layer 21 undergoes a developing process, the exposed portions are removed, then selective etching is conducted in accordance with RIE (reactive ion etching) or the like as the pattern of the photoresist layer 21 after the removal serves as a mask, and a mold structure 1 with a concavo-convex shape is thus obtained.

Note that the selective etching is conducted such that a cross-sectional shape of concave portions of the mold structure 1 with the concavo-convex shape becomes a cross-sectional shape in which the cross-sectional shape of the convex portions 3 in FIGS. 2A and 2B has been transferred.

Second Embodiment

Figure 4A:
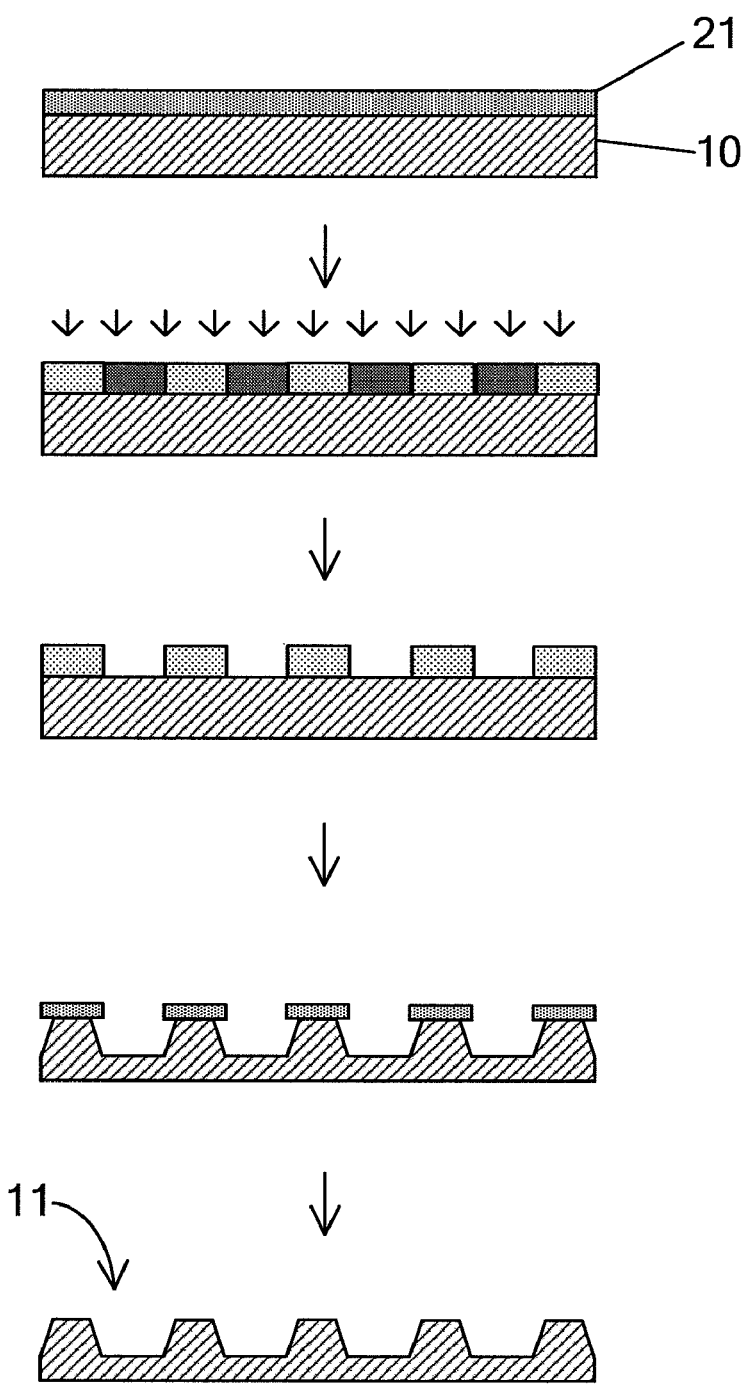
FIG. 4A is a cross-sectional view showing a method for producing a mold structure according to a second embodiment of the present invention.
Figure 4B:
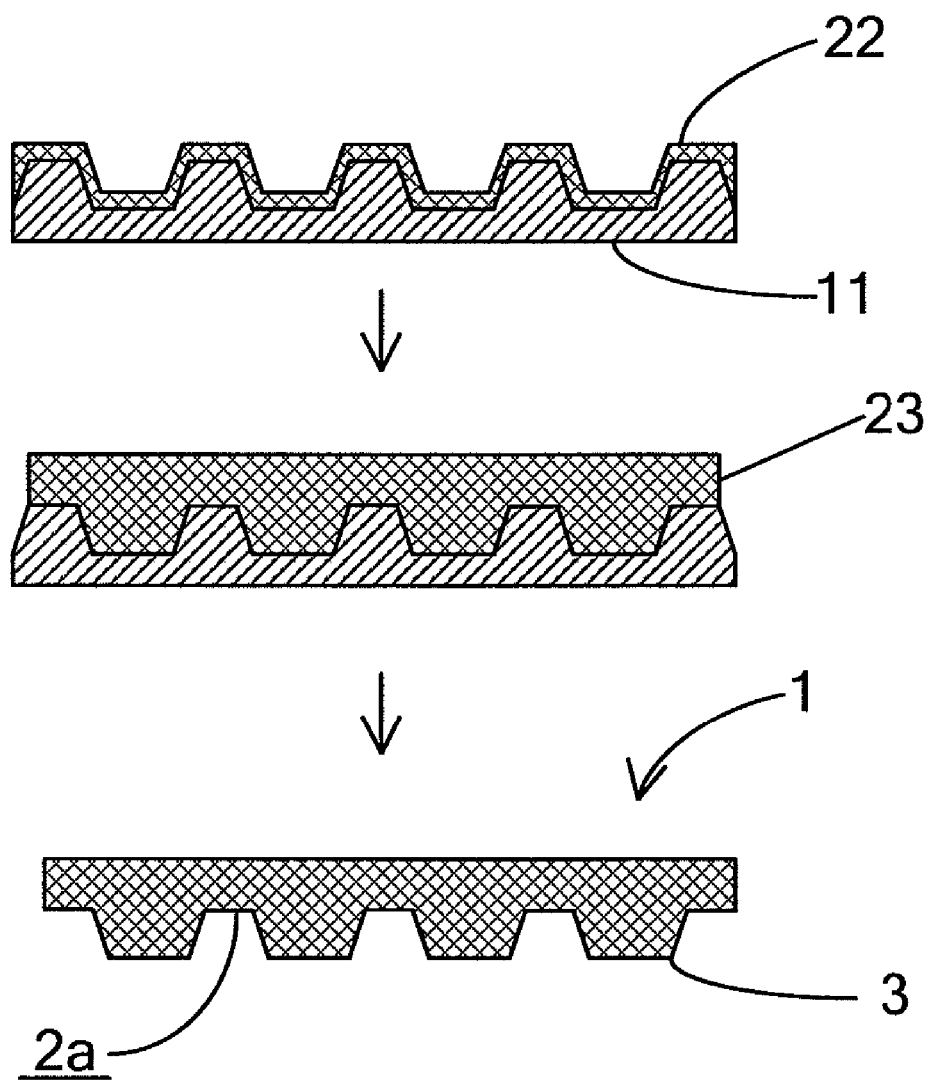
FIG. 4B is another cross-sectional view showing a method for producing the mold structure according to the second embodiment of the present invention.

FIGS. 4A to 4B are cross-sectional views showing a method for producing a mold structure according to a second embodiment. As shown in FIG. 4A, first of all, a photoresist solution of PMMA, etc. is applied onto an Si (silicon) substrate 10 by means of spin coating or the like, and a photoresist layer 21 is thus formed.

After that, while the substrate 10 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist.

Subsequently, the photoresist undergoes a developing process, the exposed portions are removed, then selective etching is conducted in accordance with RIE or the like as the photoresist pattern serves as a mask, and an original plate 11 with a concavo-convex shape is thus obtained.

Next, as shown in FIG. 4B, on the basis of the concavo-convex pattern on the surface of the original plate 11, a conductive film 22 is formed on the surface thereof by means of sputtering, electroless plating or the like. Afterward, an Ni substrate 23 with a positive concavo-convex pattern is produced by depositing the conductive film 22 in such a manner as to have a predetermined thickness by means of plating or the like, and the Ni substrate 23 is peeled off the original plate 11. Thus, a mold structure 1 is obtained.

Note that when the Ni substrate 23 is produced by depositing the conductive film 22 in such a manner as to have a predetermined thickness, the production is conducted such that a cross-sectional shape of concave portions of the Ni substrate 23 becomes a cross-sectional shape in which the cross-sectional shape of the convex portions 3 in FIGS. 2A and 2B has been transferred.

For the material for a metal substrate, Ni, Ni alloy or the like can be used as described above; to the plating by means of which to produce this substrate, metal deposition methods are applicable, including electroless plating, electroforming, sputtering and ion plating. It is desirable that the convex portion height (the concavo-convex pattern depth) H of the substrate be in the range of 30 nm to 800 nm, more desirably in the range of 50 nm to 300 nm.

In the case where this concavo-convex pattern corresponds to a servo burst signal, rectangular convex portions which are longer in the radial direction than in the circumferential direction are formed. Specifically, it is desirable that the rectangular convex portions be 0.05 µm to 20 µm long in the radial direction and 0.05 µm to 1 µm long in the circumferential direction, and it is desirable to select such values in these ranges that they become longer in the radial direction in terms of a pattern for bearing the information of a servo signal.

The conductive film 22 is formed on the concavo-convex pattern of the original plate 11 by processing a magnetic material in accordance with a vacuum deposition method such as a vacuum evaporation method, a sputtering method or an ion plating method; a plating method; or the like. It is desirable that the thickness of the Ni substrate 23 be in the range of 20 µm to 800 µm, more desirably in the range of 40 µm to 400 µm.

Third Embodiment

Figure 5:
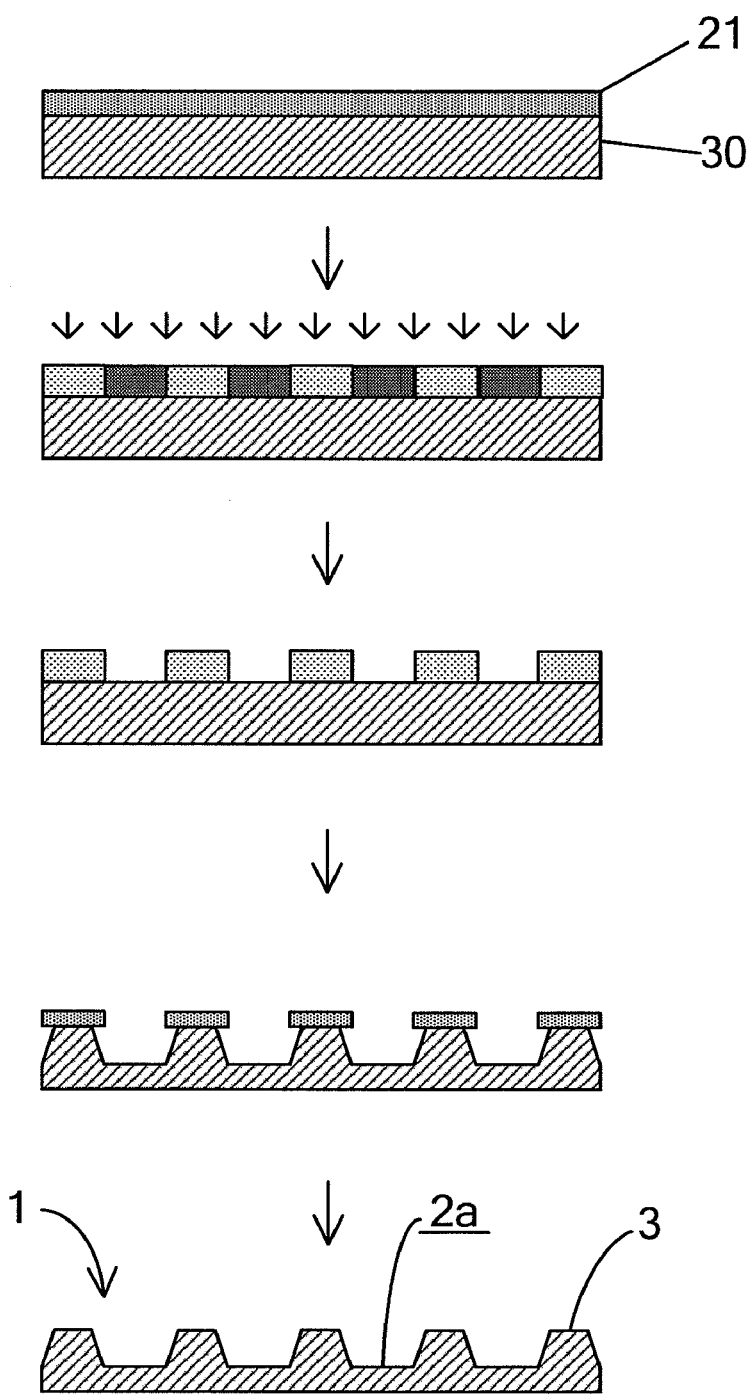
FIG. 5 is a cross-sectional view showing a method for producing a mold structure according to a third embodiment of the present invention.

FIG. 5 is a cross-sectional view showing a method for producing a mold structure according to a third embodiment. As shown in FIG. 5, first of all, a photoresist solution of PMMA, etc. is applied onto a quartz substrate 30 by means of spin coating or the like, and a photoresist layer 21 is thus formed.

After that, while the quartz substrate 30 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist.

Subsequently, the photoresist layer 21 undergoes a developing process, the exposed portions are removed, then selective etching is conducted in accordance with RIE or the like as the pattern of the photoresist layer 21 after the removal serves as a mask, and a mold structure 1 with a concavo-convex shape is thus obtained. Note that the selective etching is conducted such that a cross-sectional shape of concave portions of the mold structure 1 with the concavo-convex shape becomes a cross-sectional shape in which the cross-sectional shape of the convex portions 3 in FIGS. 2A and 2B has been transferred.

Fourth Embodiment

Figure 6A:
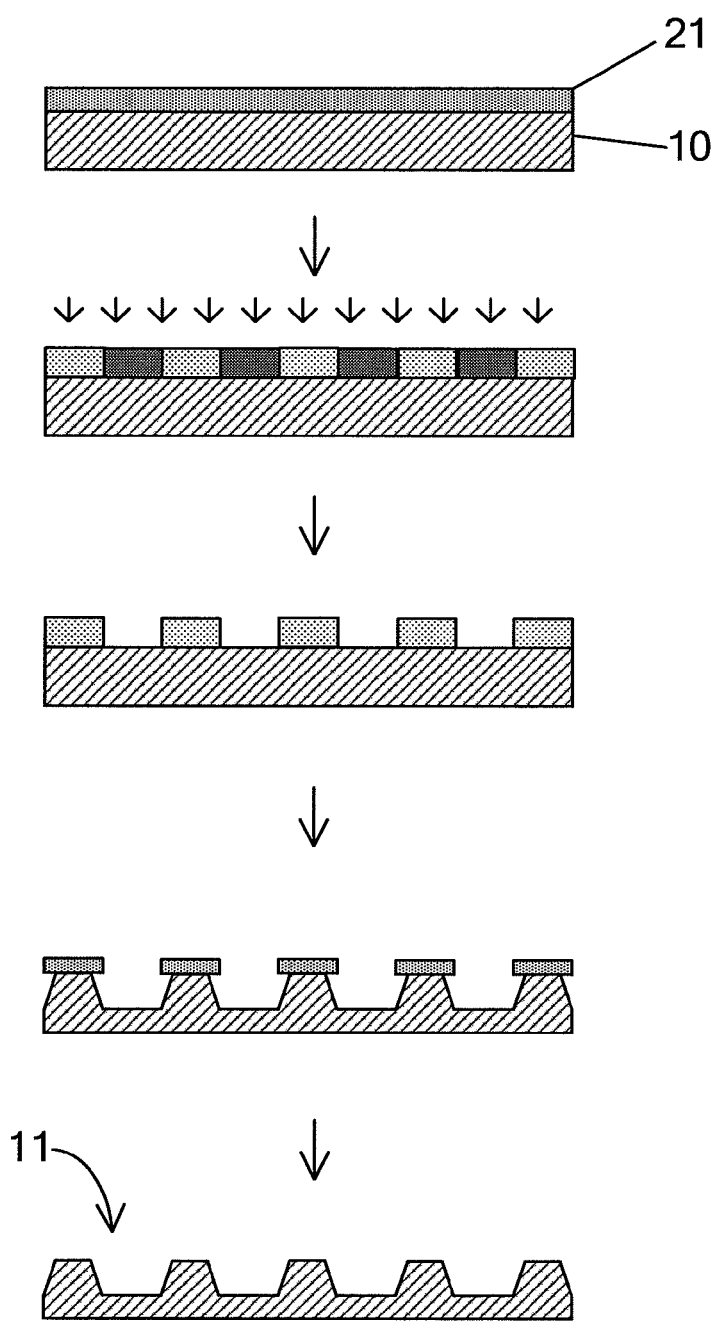
FIG. 6A is a cross-sectional view showing a method for producing a mold structure according to a fourth embodiment of the present invention.
Figure 6B:
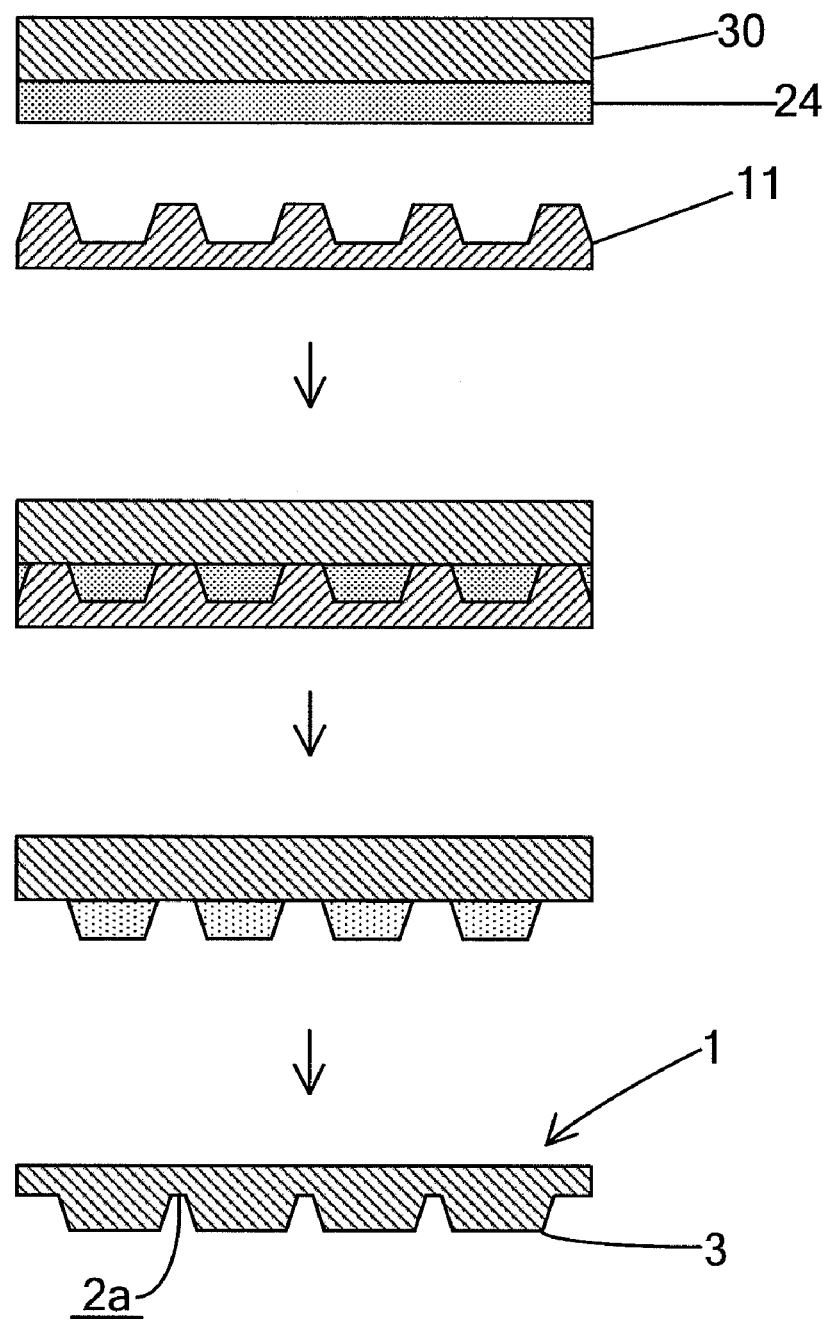
FIG. 6B is another cross-sectional view showing a method for producing the mold structure according to the fourth embodiment of the present invention.

FIGS. 6A to 6B are cross-sectional views showing a method for producing a mold structure according to a fourth embodiment. As shown in FIG. 6A, first of all, a photoresist solution of PMMA, etc. is applied onto an Si substrate 10 by means of spin coating or the like, and a photoresist layer 21 is thus formed.

After that, while the Si substrate 10 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist.

Subsequently, the photoresist layer 21 undergoes a developing process, the exposed portions are removed, then selective etching is conducted in accordance with RIE or the like as the pattern of the photoresist layer 21 after the removal serves as a mask, and an original plate 11 with a concavo-convex shape is thus obtained.

Next, as shown in FIG. 6B, the original plate 11 is pressed against a quartz substrate 30 where an imprint resist layer 24 made by applying an imprint resist solution containing a photocurable resin is formed, and the pattern of the convex portions formed on the original plate 11 is thus transferred onto the imprint resist layer 24.

Afterward, the pattern transferred is hardened by irradiating the imprint resist layer 24 with an ultraviolet ray or the like, selective etching is conducted in accordance with RIE or the like as the pattern serves as a mask, and a mold structure 1 with a concavo-convex shape is thus obtained.

Note that the selective etching is conducted such that a cross-sectional shape of concave portions of the mold structure 1 with the concavo-convex shape becomes a cross-sectional shape in which the cross-sectional shape of the convex portions 3 in FIGS. 2A and 2B has been transferred.

Fifth Embodiment

Figure 7A:
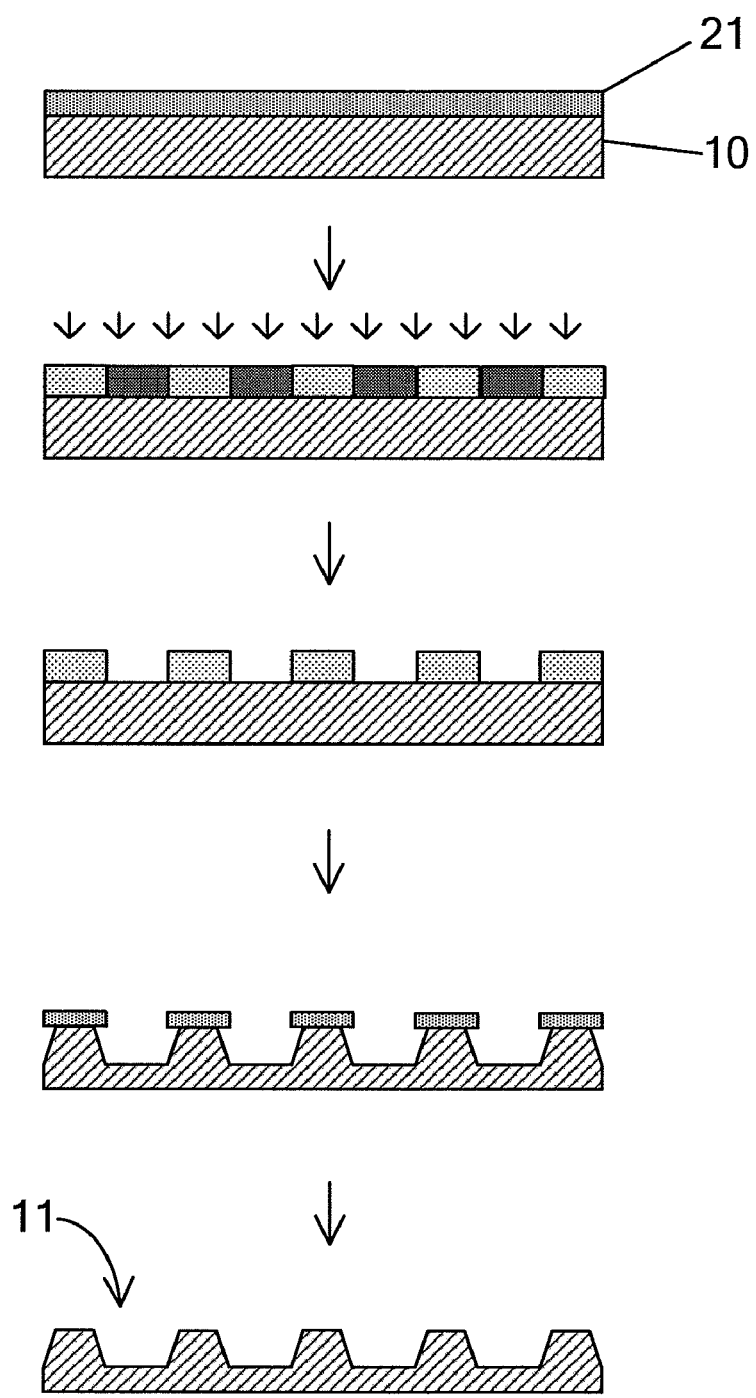
FIG. 7A is a cross-sectional view showing a method for producing a mold structure according to a fifth embodiment of the present invention.
Figure 7B:
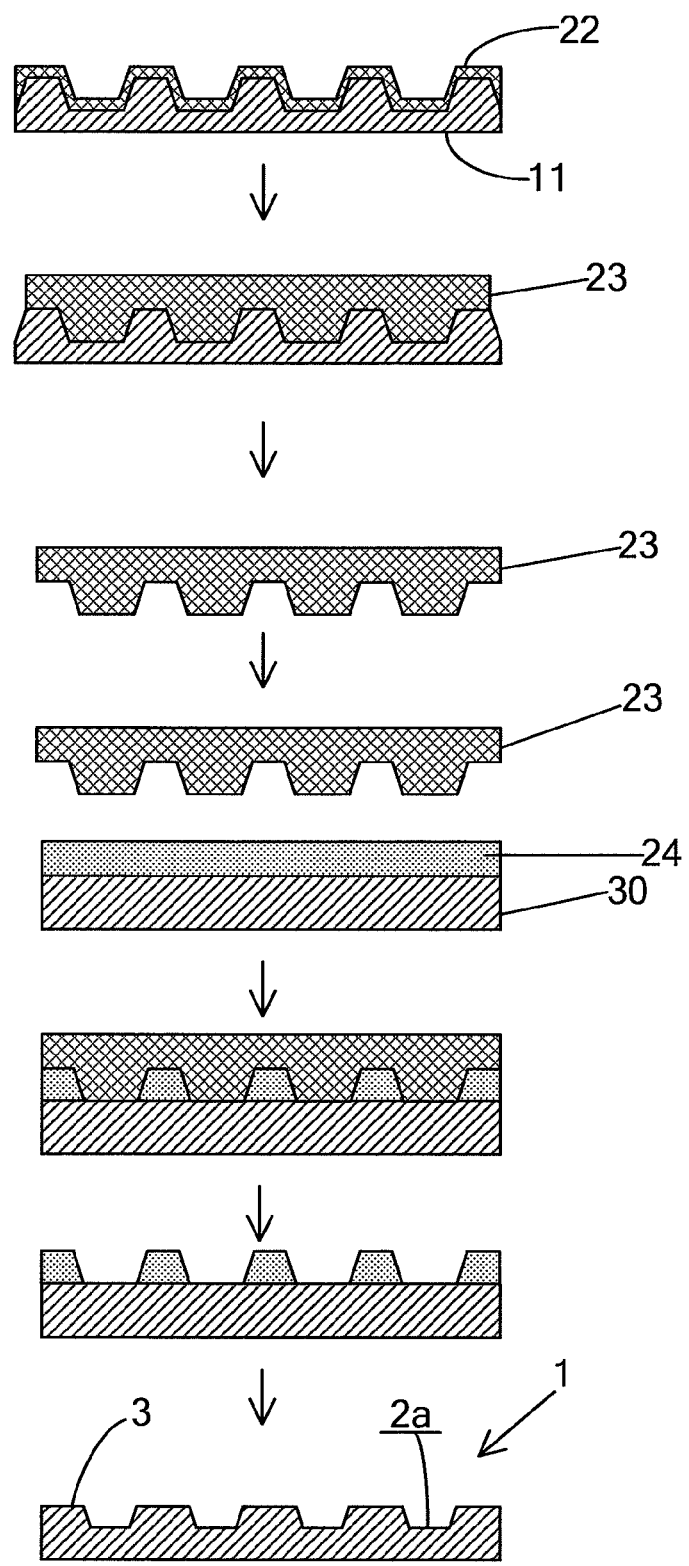
FIG. 7B is another cross-sectional view showing a method for producing the mold structure according to the fifth embodiment of the present invention.

FIGS. 7A to 7B are cross-sectional views showing a method for producing a mold structure according to a fifth embodiment. As shown in FIG. 7A, first of all, a photoresist solution of PMMA, etc. is applied onto an Si substrate 10 by means of spin coating or the like, and a photoresist layer 21 is thus formed.

After that, while the Si substrate 10 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist.

Subsequently, the photoresist layer 21 undergoes a developing process, the exposed portions are removed, then selective etching is conducted in accordance with RIE or the like as the pattern of the photoresist layer 21 after the removal serves as a mask, and an original plate 11 with a concavo-convex shape is thus obtained.

Next, as shown in FIG. 7B, the original plate 11 is pressed against a quartz substrate 30 where an imprint resist layer 24 made by applying an imprint resist solution containing a photocurable resin is formed, and the pattern of the convex portions formed on the original plate 11 is thus transferred onto the imprint resist layer 24.

Afterward, the pattern transferred is hardened by irradiating the imprint resist layer 24 with an ultraviolet ray or the like, selective etching is conducted in accordance with RIE or the like as the pattern serves as a mask, and a mold structure 1 with a concavo-convex shape is thus obtained.

Note that the selective etching is conducted such that a cross-sectional shape of concave portions of the mold structure 1 with the concavo-convex shape becomes a cross-sectional shape in which the cross-sectional shape of the convex portions 3 in FIGS. 2A and 2B has been transferred.

Sixth Embodiment

Figure 8A:
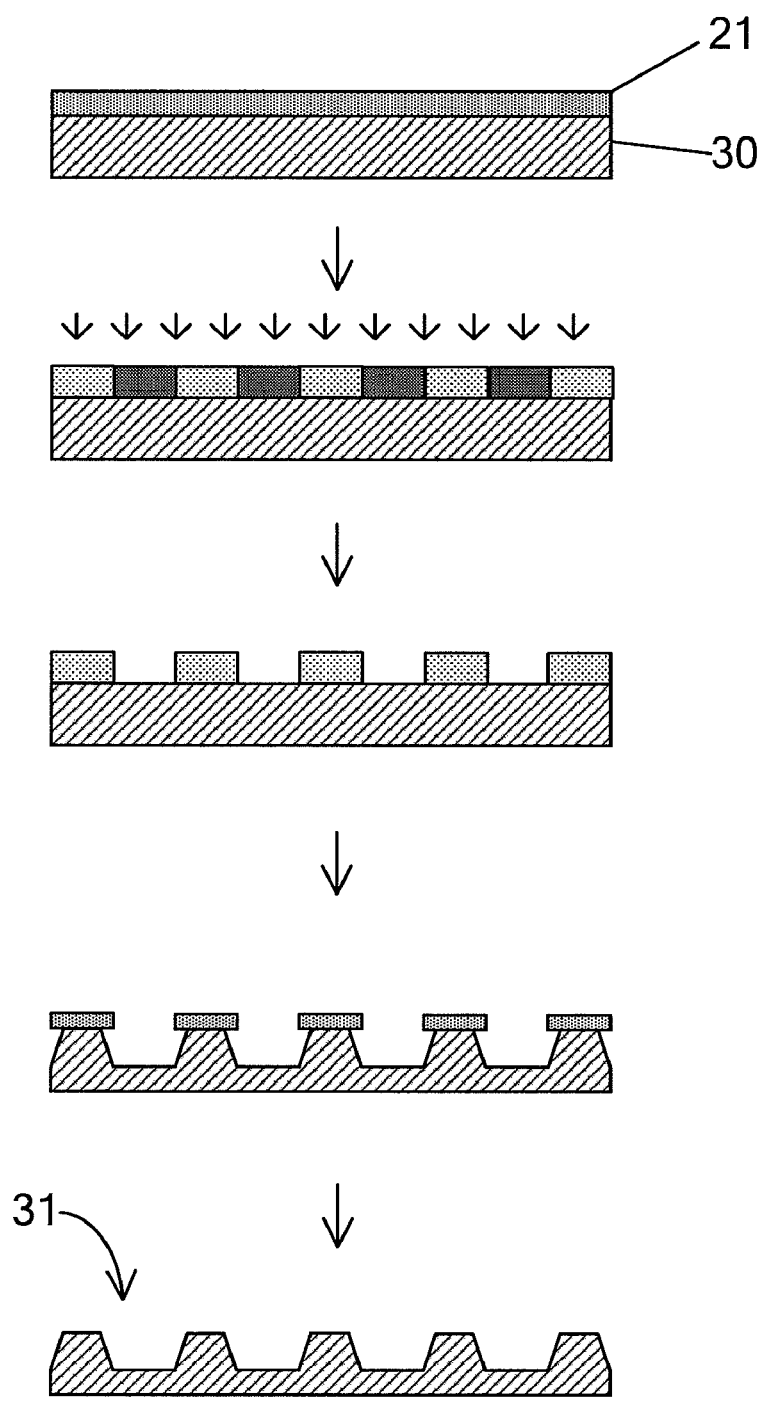
FIG. 8A is a cross-sectional view showing a method for producing a mold structure according to a sixth embodiment of the present invention.
Figure 8B:
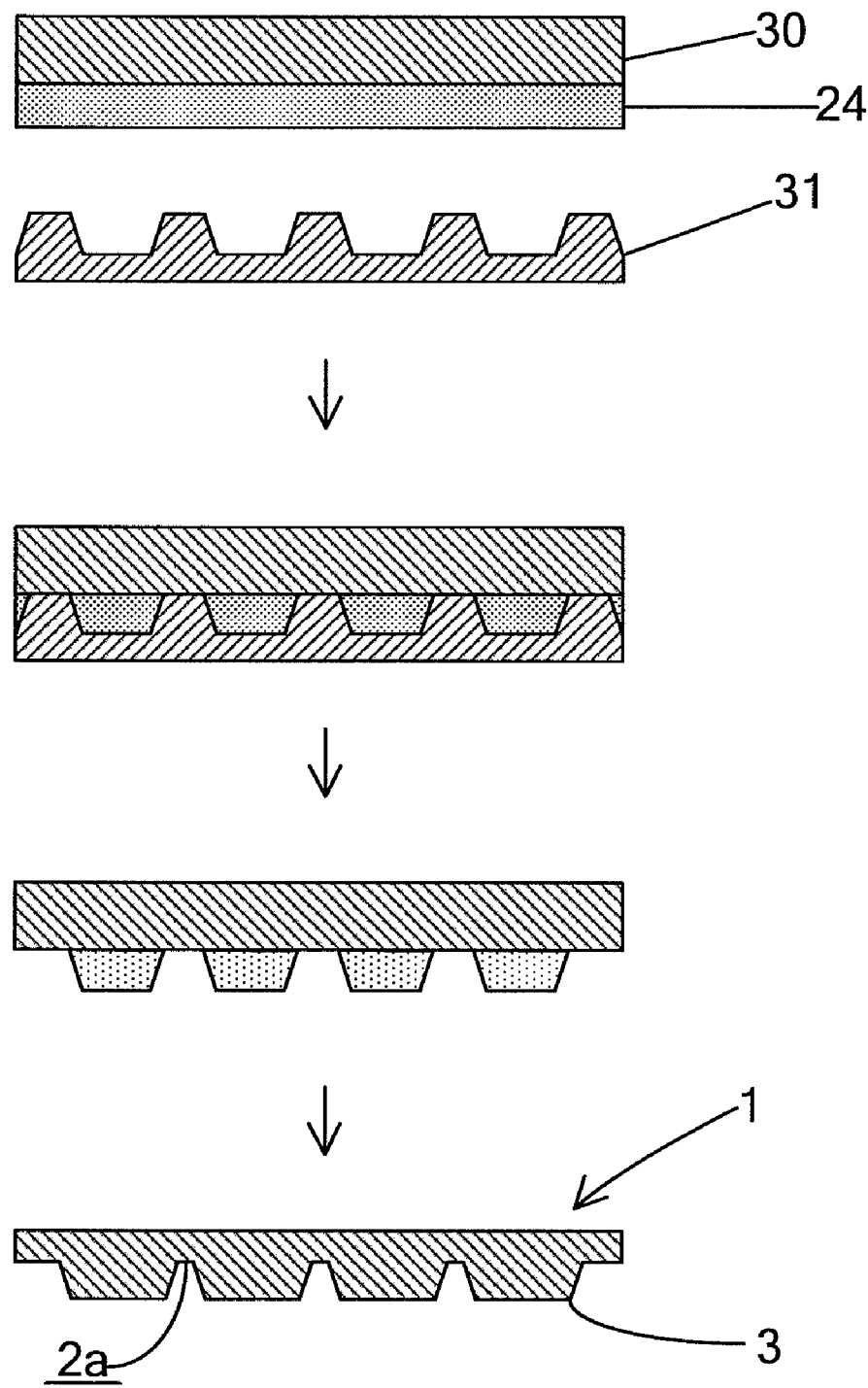
FIG. 8B is another cross-sectional view showing a method for producing the mold structure according to the sixth embodiment of the present invention.

FIGS. 8A to 8B are cross-sectional views showing a method for producing a mold structure according to a sixth embodiment. As shown in FIG. 8A, first of all, a photoresist solution of PMMA, etc. is applied onto a quartz substrate 30 by means of spin coating or the like, and a photoresist layer 21 is thus formed.

After that, while the quartz substrate 30 is being rotated, a laser beam (or an electron beam) modulated correspondingly to a servo signal is applied, and a predetermined pattern, for example a pattern corresponding to the servo signal that linearly extends in the radial direction from the rotational center to tracks, is transferred by means of exposure onto portions corresponding to circumferential frames on the whole surface of the photoresist layer 21.

Subsequently, the photoresist layer 21 undergoes a developing process, the exposed portions are removed, then selective etching is conducted in accordance with RIE or the like as the pattern of the photoresist layer 21 after the removal serves as a mask, and an original plate 31 with a concavo-convex shape is thus obtained.

Next, as shown in FIG. 8B, the original plate 31 is pressed against the quartz substrate 30 where an imprint resist layer 24 made by applying an imprint resist solution containing a photocurable resin is formed, and the pattern of the convex portions formed on the original plate 31 is thus transferred onto the imprint resist layer 24.

Afterward, the pattern transferred is hardened by irradiating the imprint resist layer 24 with an ultraviolet ray or the like, selective etching is conducted in accordance with RIE or the like as the pattern serves as a mask, and a mold structure 1 with a concavo-convex shape is thus obtained.

Note that the selective etching is conducted such that a cross-sectional shape of concave portions of the mold structure 1 with the concavo-convex shape becomes a cross-sectional shape in which the cross-sectional shape of the convex portions 3 in FIGS. 2A and 2B has been transferred.

Although exposure and developing were carried out using positive-type photoresists in the first to sixth embodiments above, it is also possible to produce a mold structure with a pattern symmetrical to that of the present embodiments by using a negative-type resist solution in place of the aforesaid resist solutions. Therefore, photoresists can be applied without any limitations in particular in the present embodiments, and either negative-type photoresists or positive-type photoresists are suitably selected according to the purpose.

Also, a substrate with a negative concavo-convex pattern may be produced by producing a second original plate in such a manner as to plate the aforesaid original plate and then conducting plating with the use of this second original plate. Further, a substrate with a positive concavo-convex pattern may be produced by producing a third original plate in such a manner as to plate the second original plate or press a resinous solution onto the second original plate and harden the resinous solution, and then plating the third original plate.

Further, although embodiments in which the imprint resist layer 24 is formed by applying an imprint resist solution containing a photocurable resin onto a substrate were explained in the fourth to sixth embodiments above, a thermoplastic resin may be contained in an imprint resist solution in place of a photocurable resin or in addition to a photocurable resin.

In the case where a thermoplastic resin is contained in an imprint resist solution, a pattern of convex portions is transferred onto the imprint resist layer 24 with the temperature of the imprint resist solution kept in the vicinity of the glass transition point (Tg) of the thermoplastic resin, then the pattern transferred is hardened by making the temperature of the imprint resist layer 24 lower than the glass transition point of the thermoplastic resin, and selective etching is conducted in accordance with RIE or the like as the pattern serves as a mask; thus, a mold structure 1 with a concavo-convex shape is obtained.

<Method for Producing Magnetic Recording Medium>

The following explains a method for producing magnetic recording media such as discrete track media and patterned media with the use of a mold structure according to the present invention, referring to the drawings.

Figure 9:
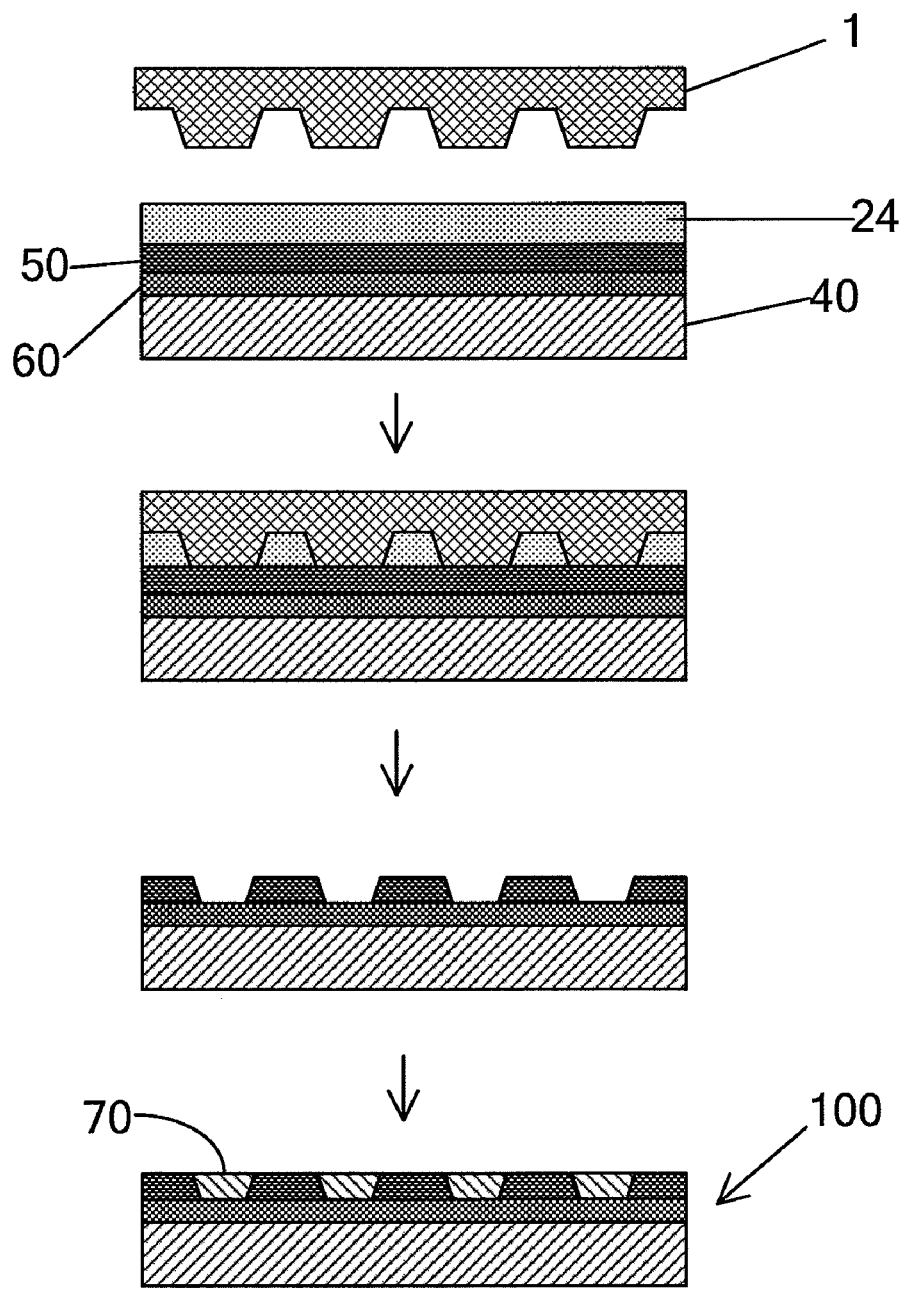
FIG. 9 is a cross-sectional view showing a method for producing a magnetic recording medium with the use of a mold structure of the present invention.

As shown in FIG. 9, for example, in the case where the mold structure 1 produced in the second embodiment above is used, by pressing the mold structure 1 against a substrate 40 of a magnetic recording medium where a magnetic layer 50 and the imprint resist layer 24 made by applying an imprint resist solution of PMMA, etc. are laid in this order and applying pressure, the pattern of the convex portions 3 formed on the mold structure 1 is transferred onto the imprint resist layer 24.

Note that when the mold structure 1 is pressed against the imprint resist layer 24, the temperature of the system is kept in the vicinity of the glass transition point (Tg) of the resist solution, and after a pattern has been transferred, the pattern is hardened by making the temperature of the imprint resist layer 24 lower than the glass transition point of the resist solution.

Subsequently, selective etching is conducted in accordance with RIE or the like as the imprint resist layer 24 to which the pattern of the convex portions 3 has been transferred serves as a mask, a concavo-convex shape which is based upon the shape of the pattern formed on the mold structure 1 is formed in the magnetic layer 50, a nonmagnetic material 70 is embedded in concave portions so as to flatten the surface, and then a protective layer and the like are formed according to necessity; thus, a magnetic recording medium 100 is obtained.

As explained above, according to a mold structure of the present invention, since portions including at least top portions of convex portions formed on a substrate of the mold structure are not shaped like rectangles but shaped like trapezoids in cross-section, the convex portions can easily be pushed into a photoresist applied onto a magnetic recording medium, and it is possible to provide a mold structure capable of easily transferring a high-quality pattern onto discrete track media and patterned media and forming the pattern thereon, with the use of a nanoimprinting technique.

Also, according to a mold structure of the present invention, since groove portions of a magnetic recording medium, which is a target transfer object, are shaped like inverted trapezoids in cross-section, the mold structure can easily be separated from the magnetic recording medium.

Furthermore, according to a mold structure of the present invention, since groove portions of a magnetic recording medium, which is a target transfer object, are shaped like inverted trapezoids in cross-section as described above, there is less crosstalk, etc., and it is possible to provide a mold structure capable of transferring a pattern of high signal integrity onto discrete track media and patterned media and forming the pattern thereon.

Since a mold structure of the present invention makes it possible to put a minute pattern formed on the mold structure into a resist on a substrate efficiently and form the pattern on the substrate with a high yield, the mold structure can be suitably used for producing discrete track media and patterned media.

What is claimed is:

1. A mold structure comprising:
a substrate, and
a plurality of convex portions formed in the shape of concentric circles at predetermined intervals on one surface of the substrate,
wherein a cross-sectional shape of the convex portions with respect to a radial direction of the concentric circles is such that a middle width M of each of the convex portions with respect to a heightwise direction is greater than a width T of a top portion of each of the convex portions with respect to the radial direction of the concentric circles, and
wherein a line width roughness value (LWR value) of the middle width M is 20 nm or less.

2. The mold structure according to claim 1, wherein the middle width M is half or less than half a track pitch P which is a sum of a cross-sectionally measured width B of an interface between each of the convex portions and one surface of the substrate and a distance L between adjacent convex portions.

3. The mold structure according to claim 1, wherein the mold structure has an aspect ratio (H/B) of 5 or less, where H is a height H of each of the convex portions in the cross-sectional shape and B is a cross-sectionally measured width B of an interface between each of the convex portions and one surface of the substrate.

4. The mold structure according to claim 1, wherein an angle θ formed between one surface of the substrate and each of side surfaces of the convex portions satisfies 45°≦θ<90°.

5. The mold structure according to claim 1, wherein one surface of the substrate and side surfaces of the convex portions are connected with each other by curved surfaces.

6. A mold structure comprising:
a substrate, and
a plurality of convex portions formed in the shape of concentric circles at predetermined intervals on one surface of the substrate,
wherein a cross-sectional shape of the convex portions with respect to a radial direction of the concentric circles is such that a middle width M of each of the convex portions with respect to a heightwise direction is greater than a width T of a top portion of each of the convex portions with respect to the radial direction of the concentric circles,
wherein a line width roughness value (LWR value) of the middle width M is 20 nm or less, and
wherein the middle width M of each of the convex portions is 50 nm or less.

* * * * *